(12) United States Patent
Greco et al.

(10) Patent No.: US 9,940,429 B2
(45) Date of Patent: Apr. 10, 2018

(54) EARLY OVERLAY PREDICTION AND OVERLAY-AWARE MASK DESIGN

(71) Applicant: International Business Machines Corporation, Armonk, NY (US)

(72) Inventors: Stephen E. Greco, Lagrangeville, NY (US); Rasit O. Topaloglu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 193 days.

(21) Appl. No.: 14/753,344

(22) Filed: Jun. 29, 2015

(65) Prior Publication Data
US 2016/0378904 A1    Dec. 29, 2016

(51) Int. Cl.
*G06F 17/50*    (2006.01)

(52) U.S. Cl.
CPC .................. *G06F 17/5081* (2013.01)

(58) Field of Classification Search
USPC .......................................................... 716/51
See application file for complete search history.

(56) References Cited

U.S. PATENT DOCUMENTS

| | | | |
|---|---|---|---|
| 6,539,521 B1 | 3/2003 | Pierrat et al. | |
| 7,700,247 B2 | 4/2010 | Ausschnitt | |
| 7,749,666 B2 | 7/2010 | Gassner et al. | |
| 8,682,634 B2 | 3/2014 | Bagheri et al. | |
| 8,778,605 B2 | 7/2014 | Ogadhoh et al. | |
| 2006/0273266 A1* | 12/2006 | Preil | G03F 1/84 250/548 |
| 2007/0035712 A1 | 2/2007 | Gassner et al. | |
| 2010/0251202 A1 | 9/2010 | Pierrat | |
| 2012/0227014 A1* | 9/2012 | Pforr | G03F 1/70 716/52 |
| 2013/0346037 A1 | 12/2013 | Pierrat | |
| 2014/0037187 A1 | 2/2014 | Marcuccilli et al. | |

* cited by examiner

*Primary Examiner* — Eric Lee
(74) *Attorney, Agent, or Firm* — Steven J. Meyers; Hoffman Warnick LLC

(57) ABSTRACT

Various embodiments include computer-implemented methods, computer program products and systems for analyzing at least one feature in a layout representing an integrated circuit (IC) for an overlay effect. In some cases, approaches include a computer-implemented method including: modeling a topography of the IC by running at least one of a chemical mechanical polishing (CMP) model, a deposition model or an etch model on a data file representing the IC after formation of an uppermost layer; modeling the at least one feature in the IC for an overlay effect using the topography model of the IC; and modifying the data file representing the IC after formation of the uppermost layer in response to detecting the overlay effect in the at least one feature, the overlay effect occurring in a layer underlying the uppermost layer.

17 Claims, 7 Drawing Sheets

EARLY OVERLAY PREDICTION AND OVERLAY-AWARE MASK DESIGN

BACKGROUND

The disclosure relates generally to integrated circuits. More particularly, various aspects relate to overlay analysis, modeling and optimization of overlay in integrated circuits.

Developing and testing integrated circuit (IC) devices, also referred to as semiconductor devices, involves designing, manufacturing and testing these devices according to desired operating parameters. Quality assurance has been a concern in the development, fabrication and testing of IC devices, but is particularly important as these devices become ever more complex.

Ever increasing pattern density and more complicated lithography techniques require a greater understanding of the placement and locational relationship between components in distinct levels of the IC. This relationship, generally referred to as overlay, can be used to predict and modify (if necessary) masking processes in the formation of an IC. However, current approaches for analyzing overlay fail to be predictive in nature, lacking models for upcoming processing nodes. These current approaches also fail to accurately characterize topographical features, and as such, can lead to costly and unnecessary late-stage modification of masking and formation processes.

BRIEF SUMMARY

Various embodiments include computer-implemented methods, computer program products and systems for analyzing at least one feature in a layout representing an integrated circuit (IC) for an overlay effect. In some cases, approaches include a computer-implemented method including: modeling a topography of the IC by running at least one of a chemical mechanical polishing (CMP) model, a deposition model or an etch model on a data file representing the IC after formation of an uppermost layer; modeling the at least one feature in the IC for an overlay effect using the topography model of the IC; and modifying the data file representing the IC after formation of the uppermost layer in response to detecting the overlay effect in the at least one feature, the overlay effect occurring in a layer underlying the uppermost layer.

A first aspect includes a computer-implemented method, performed on at least one computing device, of analyzing at least one feature in a layout representing an integrated circuit (IC) for an overlay effect, the method including: modeling a topography of the IC by running at least one of a chemical mechanical polishing (CMP) model, a deposition model or an etch model on a data file representing the IC after formation of an uppermost layer; modeling the at least one feature in the IC for an overlay effect using the topography model of the IC; and modifying the data file representing the IC after formation of the uppermost layer in response to detecting the overlay effect in the at least one feature, the overlay effect occurring in a layer underlying the uppermost layer.

A second aspect includes a system having: at least one computing device configured to analyze at least one feature in a layout representing an integrated circuit (IC) for an overlay effect by performing actions including: modeling a topography of the IC by running at least one of a chemical mechanical polishing (CMP) model, a deposition model or an etch model on a data file representing the IC after formation of an uppermost layer; modeling the at least one feature in the IC for an overlay effect using the topography model of the IC; and modifying the data file representing the IC after formation of the uppermost layer in response to detecting the overlay effect in the at least one feature, the overlay effect occurring in a layer underlying the uppermost layer.

A third aspect includes a computer program product having program code stored on a computer readable storage medium, which when executed by at least one computing device, causes the at least one computing device to analyze at least one feature in a layout representing an integrated circuit (IC) for an overlay effect by performing actions including: modeling a topography of the IC by running at least one of a chemical mechanical polishing (CMP) model, a deposition model or an etch model on a data file representing the IC after formation of an uppermost layer; modeling the at least one feature in the IC for an overlay effect using the topography model of the IC; and modifying the data file representing the IC after formation of the uppermost layer in response to detecting the overlay effect in the at least one feature, the overlay effect occurring in a layer underlying the uppermost layer.

Figure 1:
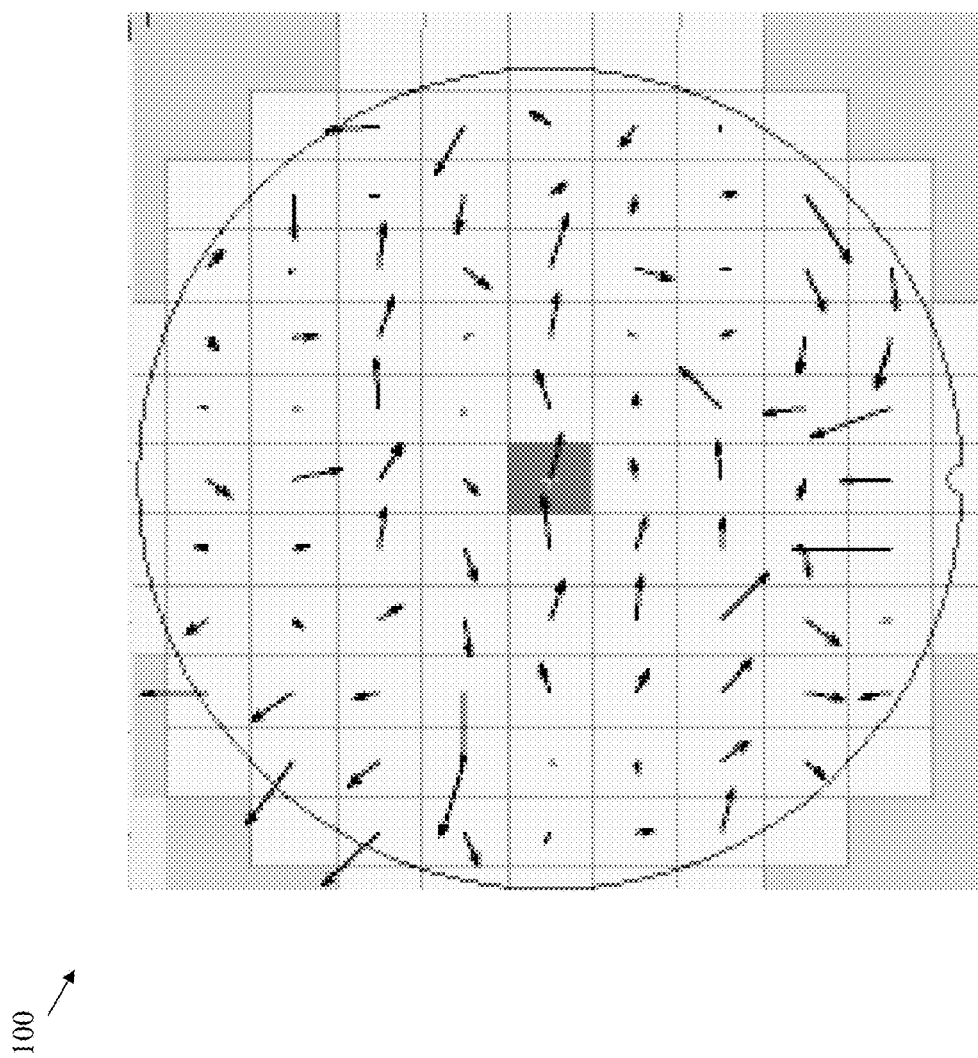
FIG. 1 shows a schematic depiction of a wafer-scale overlay map according to the prior art.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

This invention relates generally to integrated circuits. More particularly, various aspects relate to overlay analysis in integrated circuits.

As described herein, current approaches for analyzing overlay fail to accurately characterize topographical features, and as such, can lead to costly and unnecessary late-stage modification of masking and formation processes. In contrast to conventional approaches, various embodiments described herein utilize topography measurements to determine overlay characteristics in an IC, and subsequently design masking processes based upon those overlay characteristics.

In particular, various embodiments include utilizing predictive models (e.g., etch models, deposition models and chemical-mechanical polishing (CMP) models) to predict a systematic overlay map of a yet-to-be manufactured IC design. This systematic overlay map can be used to design features of the IC (and the masking process) to reduce (and potentially remove) systematic overlay.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

Figure 2:
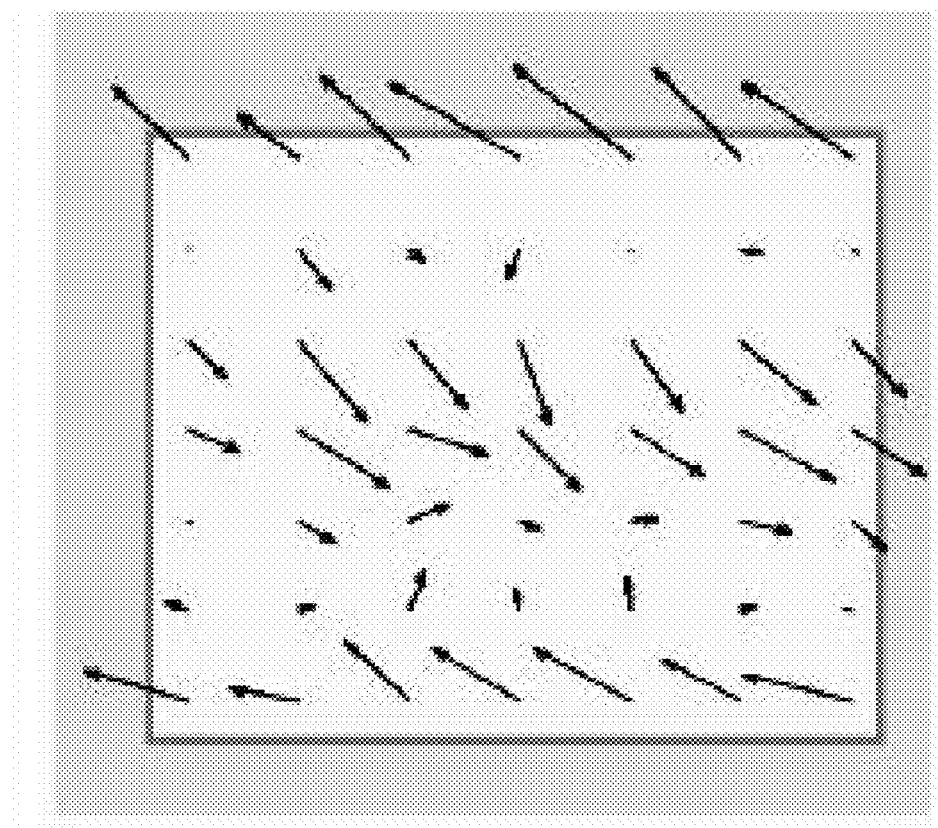
FIG. 2 shows a schematic depiction of a die-scale overlay map according to the prior art.

FIG. 1 shows a schematic depiction of a wafer-scale overlay map 100 according to the prior art. FIG. 2 shows a schematic depiction of a die-scale overlay map 200 according to the prior art. Both maps 100, 200 depict overlay using gradient vectors (arrows) either between sections of the wafer (FIG. 1) or within a die (FIG. 2). However, these conventional maps 100, 200 are created using measured overlay after masking and exposure (e.g., conventional application of a mask such as a photoresist mask, and subsequent exposure of material not obstructed by the mask to a light source) of a set of integrated circuits (ICs) (e.g., at wafer or die level). Because the overlay shown in maps 100, 200 is detected after masking and exposure, in order to correct this overlay, conventional approaches require obtaining new (corrective) masks and subsequent exposure processes in order to correct for overlay. This adds time and expense to the production cycle for the ICs.

Figure 3:
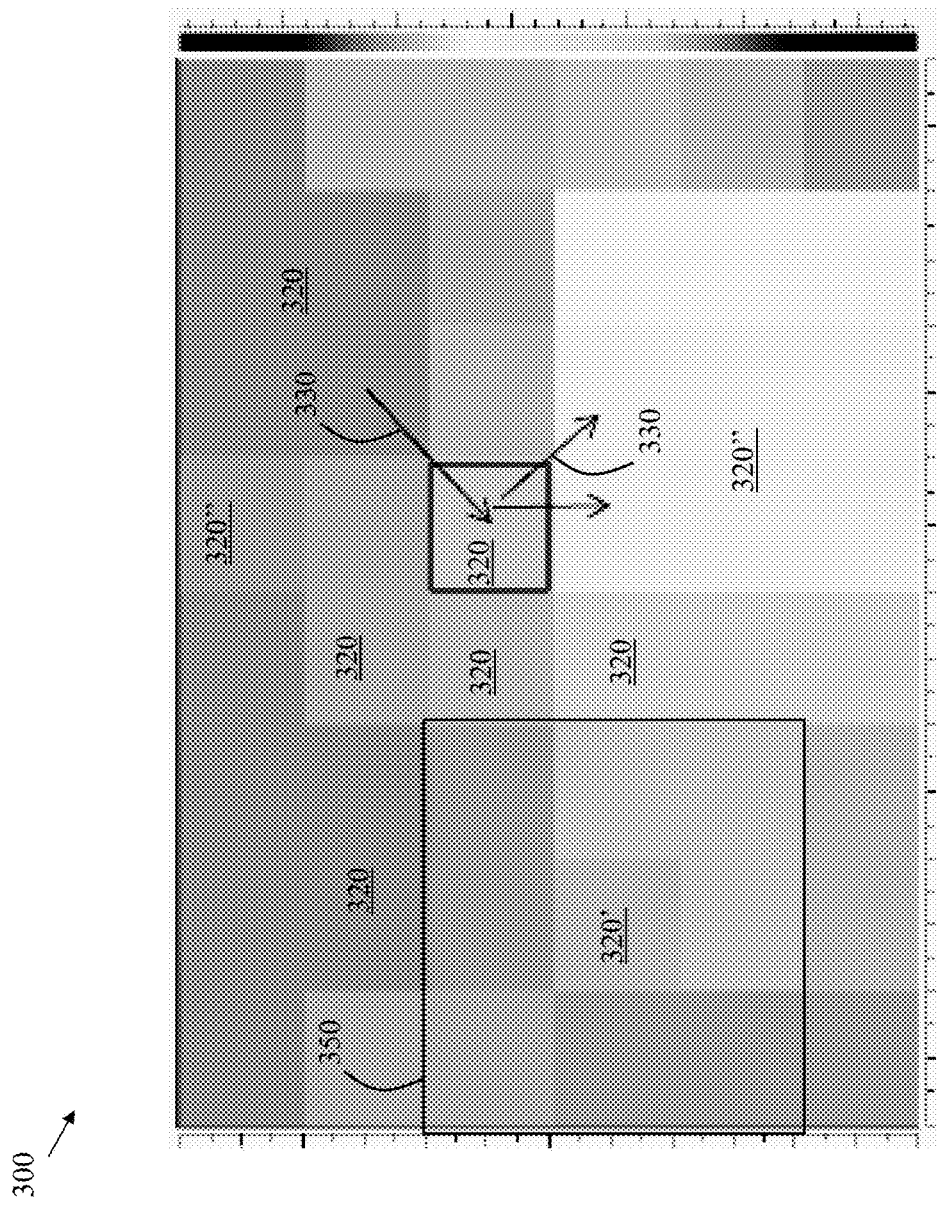
FIG. 3 shows a schematic topographical map of an IC layout according to various embodiments of the disclosure.

FIG. 3 shows a schematic topographical map 300 of an IC layout according to various embodiments of the disclosure. This topographical map 300 shows a close-up depiction of the topography of an IC wafer (or simply, IC) 310, and can be obtained using a conventional interferometer (electromagnetic) device. Topographical map 300 can indicate differences in topography between distinct regions 320 in the IC using indicators such as color, shading, intensity, etc. In various embodiments, indicators (e.g., color) in each region 320 can correspond to a topographical feature (e.g., ColorA/ShadeA/IntensityA indicates a raised topography, ColorB/ShadeB/IntensityB indicates a planar region, ColorC/ShadeC/IntensityC indicates a depressed region, etc.). Also shown, in some cases, vectors 330 indicate a difference (delta, Δ) in overlay between neighboring regions 320 (or, mask windows). Each region (window) 320 has eight (8) neighboring regions 320. In various embodiments, because each region (window) 320 has a constant of 8 neighbors (neighboring regions 320), each of the vectors 330 representing an overlay difference for each region 320 and its neighbors 320 can be divided by a constant (e.g., constant X), and then summed (added) to get a representative sum vector (V) indicating the net overlay effect of that region 320.

Figure 4:
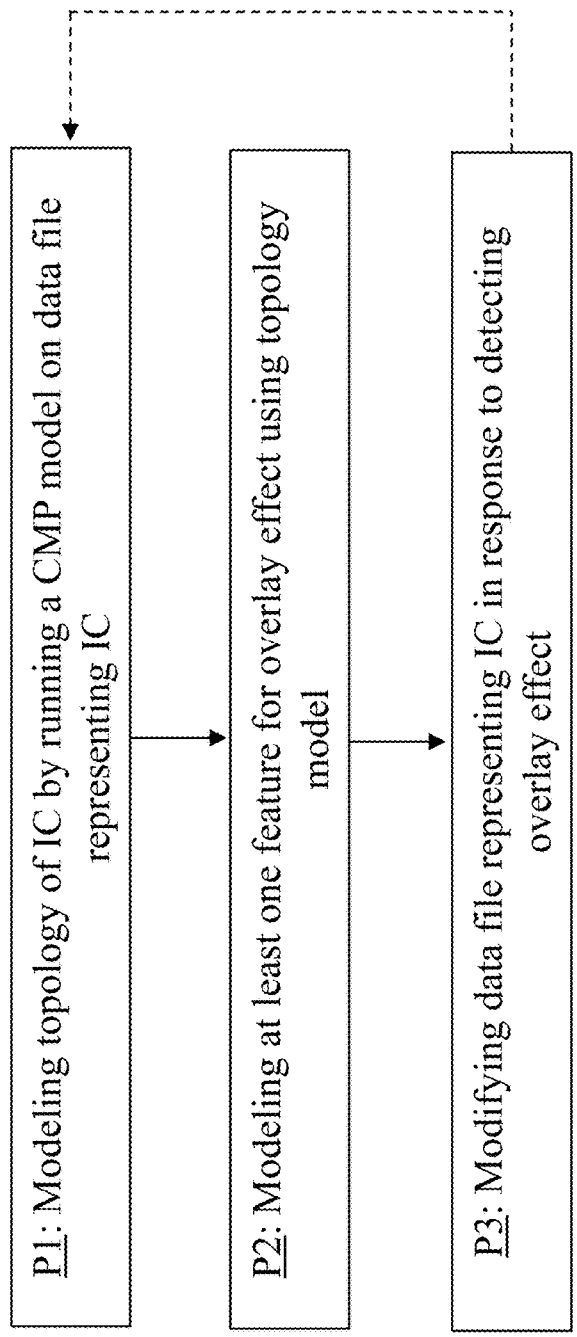
FIG. 4 shows a flow diagram depicting processes according to various embodiments.

FIG. 4 shows a flow diagram illustrating a method of analyzing at least one feature in an IC layout (as dictated in IC layout data 142, FIG. 8) according to various embodiments of the disclosure. With continuing reference to FIG. 3, and further with reference to mask layout diagrams 500, 600 and 700 in FIGS. 5, 6 and 7, respectively, the method can include the following processes:

Process P1: modeling a topography of the IC (e.g., IC topographical map 300, FIG. 3) by running at least one of a chemical mechanical polishing (CMP) model, a deposition model or an etch model on a data file representing the IC (IC layout data 142, FIG. 8), that data file representing the IC layout after formation of an uppermost layer. It is understood that the data file (IC layout data 142) represents the IC layout after an uppermost layer has been formed. As described with respect to FIG. 3, the IC layout data 142 is converted into an IC topographical map 300.

Process P2: modeling at least one feature (e.g., spacing, topography, etc.) in the IC (IC layout data 142) for an overlay effect using the topography model of the IC (IC topographical map 300). In various embodiments, the at least one feature can include a spacing between adjacent lines, line ends, via(s), one or more inter-layer features such as off-set between vertically aligned conductive components, etc. In some cases, the at least one feature can be represented by a region (window) 320 containing that feature, such that the region 320 is substantially occupied by the feature. In some cases, the process of modeling the at least one feature includes determining whether an overlay effect exists for the region 320, that is, by calculating a sum vector (V) for at least one region 320 in the IC topographical map 300. In the case that the sum vector (V) exceeds an overlay threshold (e.g., the value of V (e.g., 12 nanometers) exceeds a threshold, such as 10 nanometers), the region 320 can be characterized as having an overlay effect.

Process P3: In response to detecting an overlay effect in the feature (region 320), this process can include modifying the data file representing the IC (IC layout data 142), e.g., in order to correct (e.g., minimize) the overlay effect in the IC layout data 142. It is understood that the overlay effect occurs in a layer underlying the uppermost layer of the IC, that is, the overlay effect represents a conflict (overlay) between at least two layers below underlying the uppermost layer of the IC, or between at least one underlying layer and the uppermost layer. In various embodiments, modifying the data file can include modifying masking, etching rates/types, exposure, deposition, etc. via modification of IC layout data 142 in order to correct the overlay effect at region 320 in IC layout data 142. In some particular embodiments, this process can include modifying masking instructions (e.g., modifying instructions to change a type of one or more masks, size of one or more masks, alignment of one or more masks, etc. to form the feature) in the data file (IC layout data 142) to correct the overlay effect in the at least one feature (region 320).

In various embodiments, it is understood that the at least one feature (region 320) can include a plurality of features (regions 320) in the IC (IC layout data 142), and modeling of the at least one feature in the IC (IC layout data 142) for the overlay effect and the modifying of the data file representing the IC after formation of the uppermost layer in response to detecting the overlay effect in the at least one feature can be performed for each of the plurality of features (regions 320) in the IC (IC layout data 142).

In various embodiments, as shown in FIG. 4, process P1 can be repeated after the data file (IC layout data 142) has been modified to address the overlay effect, and in some cases, the processes P1-P3 can be iterated in order to evaluate a region 320 of an IC layout for one or more overlay effects, and/or in order to evaluate a plurality of regions 320 of an IC for a plurality of overlay effects.

In various embodiments, Process P3 (modifying of data file, IC layout data 142) can include various sub-processes. For example, these sub-processes can include:

Process P3A: inserting instructions to modify a fill effect in a region 320 containing the at least one feature or a region 320 adjacent the region 320 containing the at least one feature. Returning to FIG. 3, this can include modifying a fill effect (e.g., a deposition amount, polishing amount, epitaxial growth amount, etc.) in the region 320 having the overlay effect, or modifying the fill effect in a region 320 adjacent (contacting) the region 320 having the overlay effect. As described herein, each region 320 can have eight adjacent (contacting) regions, so this process can include modifying a fill effect in one or more of those eight regions 320, or the principal region 320 having the overlay effect.

Process P3A can further include a plurality of sub-processes. In some cases, process P3A (inserting instructions to modify fill effect in region 320' containing the at least one feature or region 320 adjacent region 320') can include:

Process P3A1: inserting instructions (in IC layout data 142) to add fill to the region 320' containing the at least one feature or the region 320 adjacent the region 320' containing the at least one feature.

Process P3A2: modeling an overlay effect (vector V) in the region 320 or the adjacent region 320'.

Process P3A3: comparing the modeled overlay effect (vector V) with an overlay vector threshold (threshold vector $V_T$) to determine whether the overlay effect (V) has been minimized (does not exceed threshold vector $V_T$).

Process P3A4 (in response to determining the modeled overlay effect (V) has not been minimized, inserting instructions to add additional fill to the region 320' or adjacent region 320.

Process P3A5 (following process P3A4): removing the instructions (from IC layout data 142) to add fill to region 320' or adjacent region 320.

Process P3A6 (following process P3A5): modeling an overlay effect (V) in region 320' or adjacent region 320 after removing instructions to add fill.

Process P3A7 (following process P3A6): inserting instructions to add fill to a distinct region 320 adjacent to region 320' or the adjacent region 320 (where region adjacent to region 320 is labelled 320"). The distinct region 320 is determined by modeling the overlay effect (V) of all regions 320 adjacent region 320', as well as calculating the overlay effect (V) in regions 320" adjacent to adjacent region 320 after removing the instructions to add fill, and selecting greatest overlay effect (V) on the region 320 or 320".

Process P3A8 (following process P3A7): modeling the overlay effect (V) for the region 320' or adjacent region 320 after adding the fill to the distinct region 320 or 320".

Process P3A9 (following process P3A8): comparing the modeled overlay effect (V) with an overlay threshold ($V_T$) to determine whether the overlay effect (V) has been minimized (does not exceed threshold).

Process P3B: following inserting instructions to modify a fill effect (Process P3A), the process can include re-modeling the topography of the IC in a focus region which surrounds the region 320 containing the at least one feature. FIG. 3 shows an example region 320' which contains the feature causing the overlay effect. Surrounding region 320' is focus region 350. This process can include determining whether an overlay effect exists within this focus region 350 surrounding region 320', and calculate the net overlay effect (vector V) of the focus region 350.

Process P3C: after determining whether a net overlay effect V exists in the focus region 350, the process can include re-modeling the at least one feature (e.g., region 320') for an overlay effect (vector V).

Process P3D: In response to detecting that an overlay effect exists in region 320' after the re-modeling, the process can include modifying the data file (IC layout data 142) to address the overlay effect (as described herein).

Figure 5:
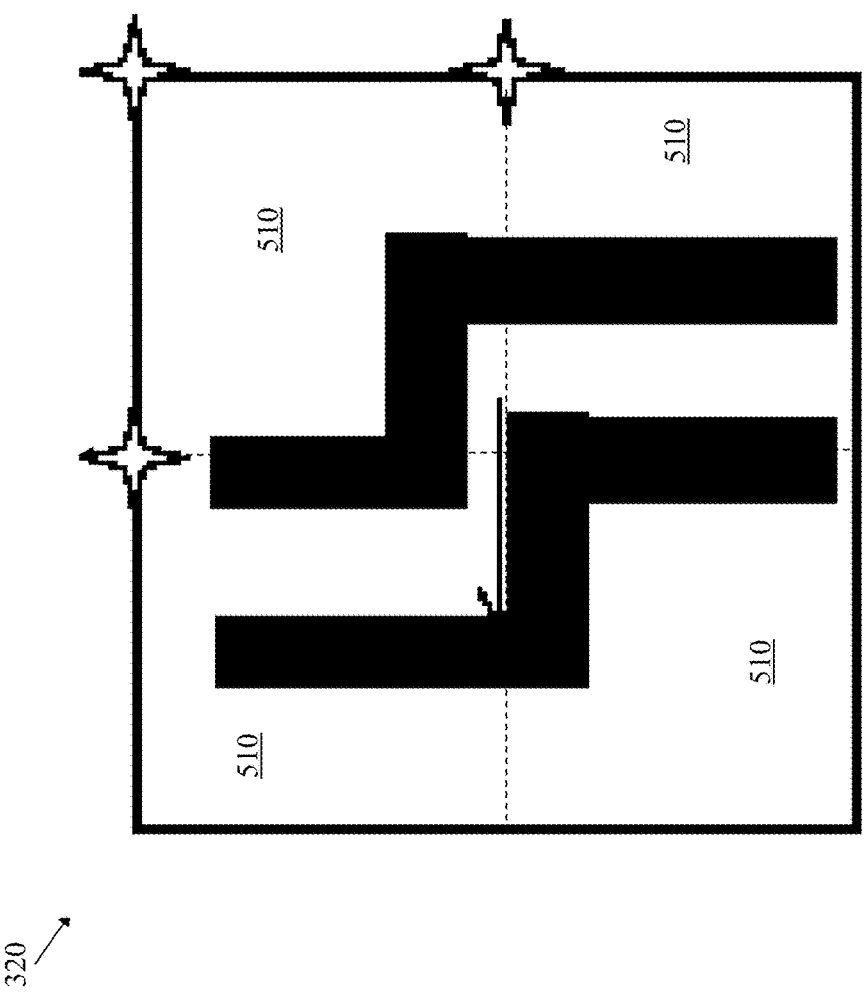
FIGS. 5 and 6 show a schematic depiction of an example process of shifting a mask overlying a region 320 within the layout of FIG. 3, according to various embodiments.
Figure 6:
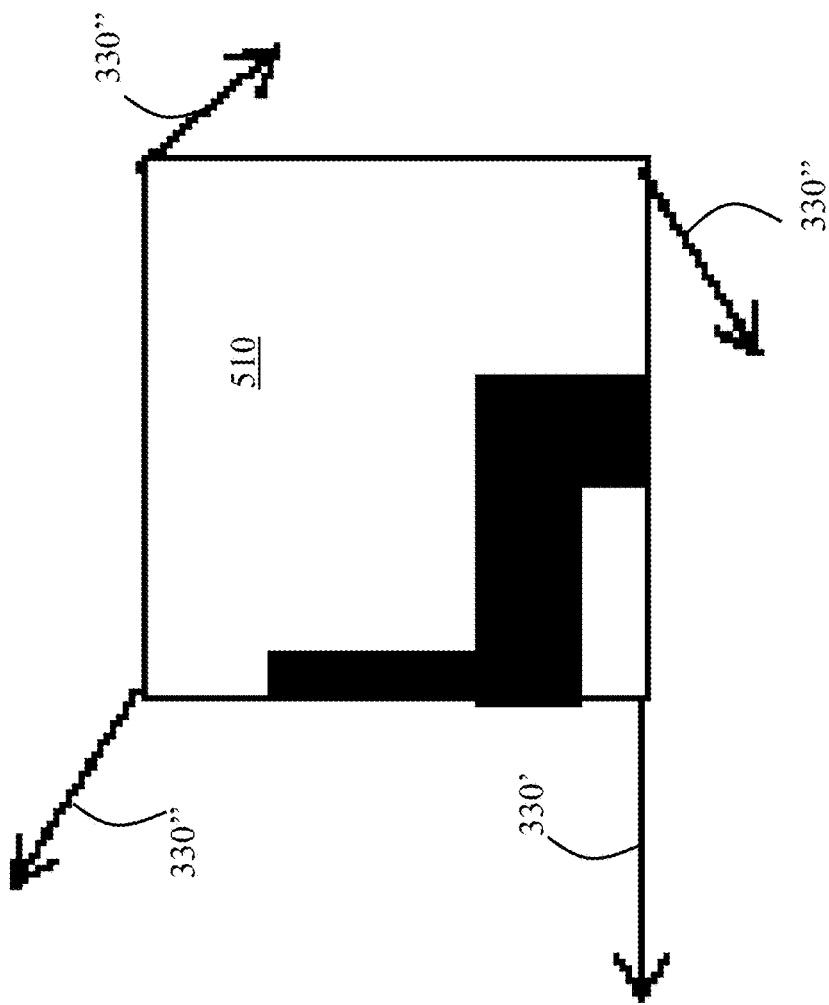

FIGS. 5-6 show a schematic depiction of an example process of shifting a mask (e.g., photoresist mask, hard mask etc.) overlying region 320 (window) within a layout 300 of an IC according to various embodiments. As shown, each region 320 can be divided into quadrants 510, where each quadrant 510 is assigned four (4) vectors 330. In particular, each quadrant 510 includes the center vector 330' for the window, as well as three corner vectors 330" (FIG. 6) which are summation vectors of neighboring vectors from adjacent regions 320 (or 320', or 320"). Corner vectors 330" are calculated first, and correspond with star locations in FIG. 5. For each quadrant 510, vectors are averaged according to the following:

$$|v|/(1+\theta \cdot d) \qquad \text{(Equation 1)}$$

Where |v| is the overlay vector magnitude, d is the distance to each corner location (origin of vectors 330"), and θ is a constant per each layer of the IC. Following determining the overlay vector magnitude for each quadrant 510, vectors |v| are averaged by area ratio, and a summation vector V is calculated for the region 320.

It is understood that according to various embodiments, the mask shifting process illustrated in FIGS. 5-6 can be modified to account for distinctions in characteristics of underlying layers. For example, where a via (interconnect) is present in the layer below region 320, correcting for the overlay effect (V) can be limited by the position of the via. For example, when shifting a mask, the movement of that mask may be limited by the location of the via such that the mask is shifted until it meets a border of the via.

It is understood that the process of shifting (e.g., shifting a mask) includes moving that mask in an opposite direction and magnitude of the corresponding overlay vector (e.g., summation vector V) attributed with that feature (and in that layer) of the IC. In contrast to fill-based optimization approaches described herein, the shift-based approaches shown and described with respect to FIGS. 5-6 address multi-layer affects separately (as the topography and overlay models in fill-based approaches already contain multi-layer effects). In the shift-based approaches, if an object (e.g., mask object) is shifted in a lower (underlying) layer, it is not necessarily accounted for in the topography and overlay models, and can result in an erroneous shift for the upper (overlying) layer. As such, various approaches herein track shifting in lower layers, and instead of shifting an overlying layer by the vector for that layer, these approaches calculate summation vector V, which accounts for overlay in other (e.g., underlying) layers.

In particular embodiments, this process (modifying masking instructions, Process P3, e.g., by shifting) can include:

P3S1: dividing a region 320 containing the at least one feature into quadrants 510;

P3S2: calculating an overlay vector quantity (330' and 330") for each of the quadrants 510;

P3S3: averaging the overlay vector quantities (330' and 330") for all of the quadrants 510 to determine a summation vector V for the region 320; and P3S4: shifting, in the mask instructions (in IC layout data 142), a location of a mask used to form the at least one feature in an opposite direction and at an opposite magnitude as the summation vector V for the region 320.

In various embodiments, this shift approach includes calculating segment overlay vectors for a particular feature, and determining which lower-layer segments overlap a given segment in an overlying layer. This approach can further include averaging shifts based upon lower segment-to-upper segment overlap areas, e.g., where two lower layer segments overlap an upper layer segment, the larger lower-layer segment is given greater weight. As this multi-layer shift-based approach can be computationally demanding, various aspects focus on specific overlay couples (e.g., adjacent features) instead of analyzing an entire layout. For example, this may include analyzing only those segments that are close to vias which extend to a neighboring layer (e.g., using an algorithm which captures a fixed area around each via, identifies neighboring layer interconnects that overlap this fixed area, and focuses only on optimization of those interconnects).

Figure 7:
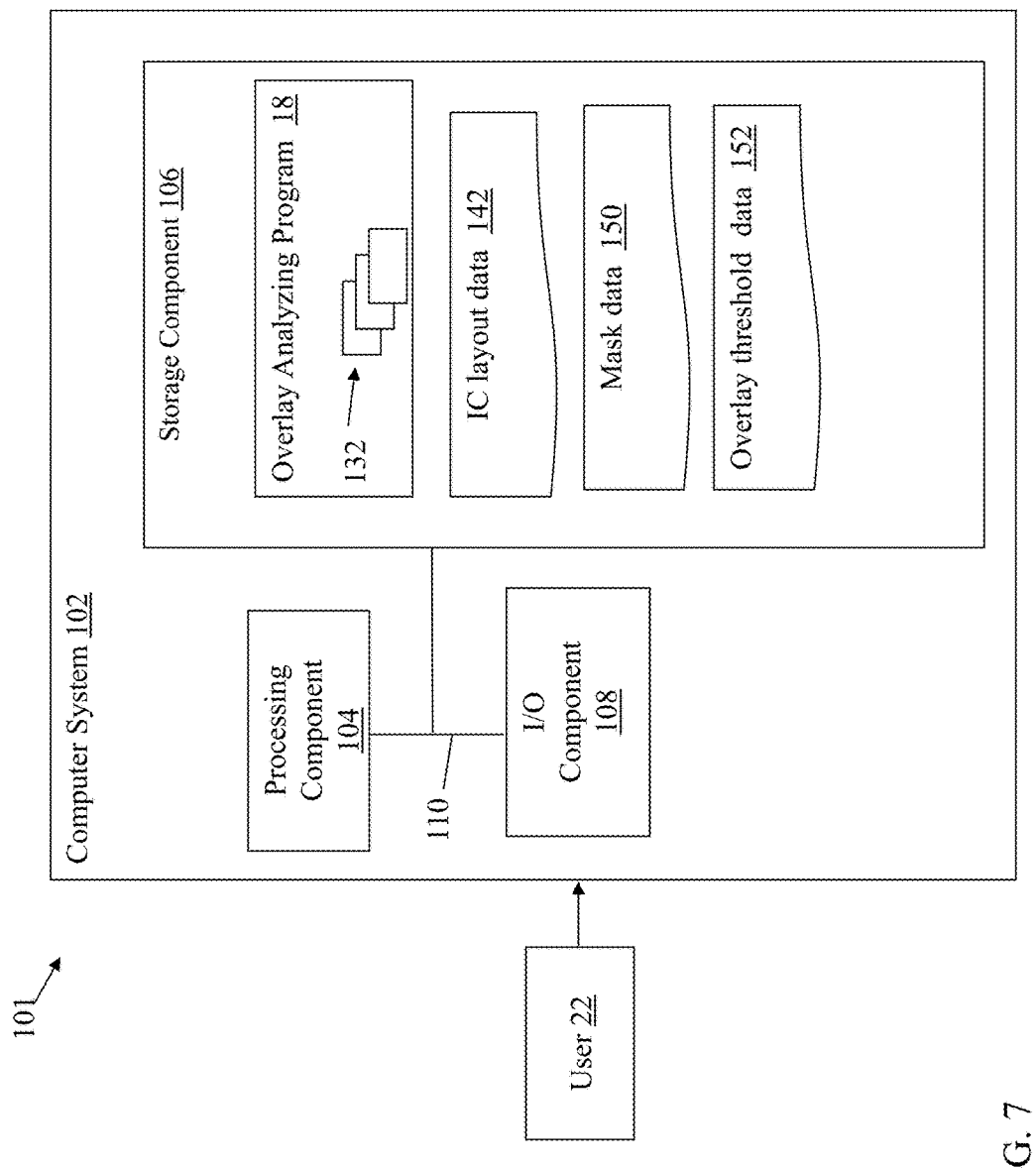
FIG. 7 shows an illustrative environment for performing processes according to various embodiments.

Turning more specifically to FIG. 7, the environment 101 includes a computer system 102 that can perform a process described herein in order analyze at least one feature in an integrated circuit (IC) layout for an overlay effect. In particular, the computer system 102 is shown as including an overlay analyzing program 18, which makes computer system 102 operable to analyze at least one feature from an IC layout (IC layout data 142) for an overlay effect by performing any/all of the processes described herein and implementing any/all of the embodiments described herein.

The computer system 102 is shown including a processing component 104 (e.g., one or more processors), a storage component 106 (e.g., a storage hierarchy), an input/output (I/O) component 108 (e.g., one or more I/O interfaces and/or devices), and a communications pathway 110. In general, the processing component 104 executes program code, such as the overlay analyzing program 18, which is at least partially fixed in the storage component 106. While executing program code, the processing component 104 can process data, which can result in reading and/or writing transformed data from/to the storage component 106 and/or the I/O component 108 for further processing. The pathway 110 provides a communications link between each of the components in the computer system 102. The I/O component 108 can comprise one or more human I/O devices, which enable a user (e.g., a human or other user) 22 to interact with the computer system 102 and/or one or more communications devices to enable a system user 22 to communicate with the computer system 102 using any type of communications link. To this extent, the overlay analyzing program 18 can manage a set of interfaces (e.g., graphical user interface(s), application program interface, etc.) that enable human and/or system users 22 to interact with the overlay analyzing program 18. Further, the overlay analyzing program 18 can manage (e.g., store, retrieve, create, manipulate, organize, present, etc.) data, such as IC layout data 142, mask data 150 and/or overlay threshold data 152, using any solution.

In any event, the computer system 102 can comprise one or more general purpose computing articles of manufacture (e.g., computing devices) capable of executing program code, such as the overlay analyzing program 18, installed thereon. As used herein, it is understood that "program code" means any collection of instructions or algorithms, in any language, code or notation, that cause a computing device having an information processing capability to perform a particular function either directly or after any combination of the following: (a) conversion to another language, code or notation; (b) reproduction in a different material form; and/or (c) decompression. To this extent, the overlay analyzing program 18 can be embodied as any combination of system software and/or application software.

Further, the overlay analyzing program 18 can be implemented using a set of modules 132. In this case, a module 132 can enable the computer system 102 to perform a set of tasks used by the overlay analyzing program 18, and can be separately developed and/or implemented apart from other portions of the overlay analyzing program 18. As used herein, the term "component" means any configuration of hardware, with or without software, which implements the functionality described in conjunction therewith using any solution, while the term "module" means program code that enables the computer system 102 to implement the functionality described in conjunction therewith using any solution. When fixed in a storage component 106 of a computer system 102 that includes a processing component 104, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 102.

When the computer system 102 comprises multiple computing devices, each computing device may have only a portion of overlay analyzing program 18 fixed thereon (e.g., one or more modules 132). However, it is understood that the computer system 102 and overlay analyzing program 18 are only representative of various possible equivalent computer systems that may perform a process described herein. To this extent, in other embodiments, the functionality provided by the computer system 102 and overlay analyzing program 18 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 102 includes multiple computing devices, the computing devices can communicate over any type of communications link. Further, while performing a process described herein, the computer system 102 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 102 can obtain or provide data, such as IC layout data 142 (e.g., information about the layout of the IC, including features, spacings, tolerances, inter-level effects, etc.), mask data 150 (e.g., information about mask size, shape, location, type, etc. used to form features in IC layout) and/or overlay threshold data 152 (e.g., data about acceptable overlays for particular features, regions 320, etc. in the IC layout) using any solution. For example, the computer system 102 can generate and/or be used to retrieve IC layout data 142, mask data 150 and/or overlay threshold data 152 from one or more data stores, receive IC layout data 142, mask data 150 and/or overlay threshold data 152 from another system, send IC layout data 142, mask data 150 and/or overlay threshold data 152 to another system, etc.

While shown and described herein as methods, systems, and computer program products for analyzing at least one feature in an IC layout for an overlay effect, it is understood that aspects of the invention further provide various alternative embodiments. For example, in one embodiment, the invention provides a computer program fixed in at least one computer-readable medium, which when executed, enables a computer system to analyze at least one feature in an IC layout for an overlay effect. To this extent, the computer-readable medium includes program code, such as the overlay analyzing program 18 (FIG. 7), which implements some or all of the processes and/or embodiments described herein. It is understood that the term "computer-readable medium"

comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the overlay analyzing program 18 (FIG. 7), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for analyzing feature(s) in an IC layout for overlay effects. In this case, a computer system, such as the computer system 102 (FIG. 7), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

It is understood that aspects of the invention can be implemented as part of a business method that performs a process described herein on a subscription, advertising, and/or fee basis. That is, a service provider could offer to generate a scatterometry library as described herein. In this case, the service provider can manage (e.g., create, maintain, support, etc.) a computer system, such as computer system 102 (FIG. 7), that performs a process described herein for one or more customers. In return, the service provider can receive payment from the customer(s) under a subscription and/or fee agreement, receive payment from the sale of advertising to one or more third parties, and/or the like.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A computer-implemented method, performed on at least one computing device, of analyzing at least one feature in a layout representing an integrated circuit (IC) for an overlay effect, the method comprising:
   modeling a topography of the IC by running at least one of a chemical mechanical polishing (CMP) model, a deposition model or an etch model on a data file representing the IC after formation of an uppermost layer;
   modeling the at least one feature in the IC for an overlay effect using the topography model of the IC; and
   modifying the data file representing the IC after formation of the uppermost layer in response to detecting the overlay effect in the at least one feature, the overlay effect occurring in a layer underlying the uppermost layer,
   wherein the modifying of the data file includes:
      inserting instructions to modify a fill effect in a region containing the at least one feature or a region adjacent the region containing the at least one feature, wherein the instructions to modify the fill effect are used to control manufacture of the IC;
      re-modeling the topography of the IC in a focus region surrounding the region containing the at least one feature;
      re-modeling the at least one feature for an overlay effect; and
      modifying the data file in response to detecting the overlay effect in the at least one feature after the re-modeling.

2. The computer-implemented method of claim 1, wherein the modifying of the data file includes modifying masking instructions in the data file to correct the overlay effect in the at least one feature, the masking instructions used to control the manufacture of the IC, the modifying of masking instructions including:
   dividing a region containing the at least one feature into quadrants;
   calculating an overlay vector quantity for each of the quadrants;
   averaging the overlay vector quantities for all of the quadrants to determine a summation vector for the region; and
   shifting, in the mask instructions, a location of a mask used to form the at least one feature in an opposite direction and at an opposite magnitude as the summation vector for the region.

3. The computer-implemented method of claim 1, wherein the inserting of instructions to modify the fill effect in the region containing the at least one feature or the region adjacent the region containing the at least one feature includes:
   inserting instructions to add fill to the region containing the at least one feature or the region adjacent the region containing the at least one feature;
   modeling an overlay effect in the region or the adjacent region; and
   comparing the modeled overlay effect with an overlay vector threshold to determine whether the overlay effect has been minimized.

4. The computer-implemented method of claim 3, wherein the inserting of instructions further includes:
   inserting instructions to add additional fill to the region or the adjacent region in response to determining the modeled overlay effect has not been minimized.

5. The computer-implemented method of claim 3, wherein the inserting of instructions further includes:
   removing the instructions to add fill to the region or the adjacent region;
   modeling an overlay effect in the region or the adjacent region after removing the instructions to add fill;
   inserting instructions to add fill to a distinct region adjacent the region or the adjacent region, the distinct region having a greatest influence on the overlay effect based upon the modeled overlay effect in the region or the adjacent region after removing the instructions to add fill;
   modeling the overlay effect for the region or the adjacent region after adding the fill to the distinct region; and
   comparing the modeled overlay effect with an overlay threshold to determine whether the overlay effect has been minimized.

6. The computer-implemented method of claim 1, wherein the at least one feature includes a plurality of features in the IC, and wherein the modeling of the at least one feature in the IC for the overlay effect and the modifying of the data file representing the IC after formation of the uppermost layer in response to detecting the overlay effect in the at least one feature is performed for each of the plurality of features in the IC.

7. A system comprising:
   at least one computing device configured to analyze at least one feature in a layout representing an integrated circuit (IC) for an overlay effect by performing actions including:
      modeling a topography of the IC by running at least one of a chemical mechanical polishing (CMP) model, a deposition model or an etch model on a data file representing the IC after formation of an uppermost layer;
      modeling the at least one feature in the IC for an overlay effect using the topography model of the IC; and
      modifying the data file representing the IC after formation of the uppermost layer in response to detecting the overlay effect in the at least one feature, the overlay effect occurring in a layer underlying the uppermost layer,
      wherein the modifying of the data file includes:
         inserting instructions to modify a fill effect in a region containing the at least one feature or a region adjacent the region containing the at least one feature, wherein the instructions to modify the fill effect are used to control manufacture of the IC;
         re-modeling the topography of the IC in a focus region surrounding the region containing the at least one feature;
         re-modeling the at least one feature for an overlay effect; and
         modifying the data file in response to detecting the overlay effect in the at least one feature after the re-modeling.

8. The system of claim 7, wherein the modifying of the data file includes modifying masking instructions in the data file to correct the overlay effect in the at least one feature, the masking instructions used to control the manufacture of the IC, the modifying of masking instructions including:

dividing a region containing the at least one feature into quadrants;
calculating an overlay vector quantity for each of the quadrants;
averaging the overlay vector quantities for all of the quadrants to determine a summation vector for the region; and
shifting, in the mask instructions, a location of a mask used to form the at least one feature in an opposite direction and at an opposite magnitude as the summation vector for the region.

9. The system of claim 7, wherein the inserting of instructions to modify the fill effect in the region containing the at least one feature or the region adjacent the region containing the at least one feature includes:
inserting instructions to add fill to the region containing the at least one feature or the region adjacent the region containing the at least one feature;
modeling an overlay effect in the region or the adjacent region; and
comparing the modeled overlay effect with an overlay vector threshold to determine whether the overlay effect has been minimized.

10. The system of claim 9, wherein the inserting of instructions further includes:
inserting instructions to add additional fill to the region or the adjacent region in response to determining the modeled overlay effect does not exceed the threshold.

11. The system of claim 9, wherein the inserting of instructions further includes:
removing the instructions to add fill to the region or the adjacent region;
modeling an overlay effect in the region or the adjacent region after removing the instructions;
inserting instructions to add fill to a distinct region adjacent the region or the adjacent region, the distinct region having a greatest influence on the overlay effect based upon the modeled overlay effect in the region or the adjacent region after removing the instructions to add fill;
modeling the overlay effect for the region or the adjacent region after adding the fill to the distinct region; and
comparing the modeled overlay effect with an overlay threshold to determine whether the overlay effect has been minimized.

12. The system of claim 7, wherein the at least one feature includes a plurality of features in the IC, and wherein the modeling of the at least one feature in the IC for the overlay effect and the modifying of the data file representing the IC after formation of the uppermost layer in response to detecting the overlay effect in the at least one feature is performed for each of the plurality of features in the IC.

13. A computer program product comprising program code stored on a non-transitory computer readable medium, which when executed by at least one computing device, causes the at least one computing device to analyze at least one feature in a layout representing an integrated circuit (IC) for an overlay effect by performing actions including:
modeling a topography of the IC by running at least one of a chemical mechanical polishing (CMP) model, a deposition model or an etch model on a data file representing the IC after formation of an uppermost layer;
modeling the at least one feature in the IC for an overlay effect using the topography model of the IC; and
modifying the data file representing the IC after formation of the uppermost layer in response to detecting the overlay effect in the at least one feature, the overlay effect occurring in a layer underlying the uppermost layer,
wherein the modifying of the data file includes:
inserting instructions to modify a fill effect in a region containing the at least one feature or a region adjacent the region containing the at least one feature wherein the instructions to modify the fill effect are used to control manufacture of the IC;
re-modeling the topography of the IC in a focus region surrounding the region containing the at least one feature;
re-modeling the at least one feature for an overlay effect; and
modifying the data file in response to detecting the overlay effect in the at least one feature after the re-modeling.

14. The computer program product of claim 13, wherein the modifying of the data file includes modifying masking instructions in the data file to correct the overlay effect in the at least one feature, the masking instructions used to control the manufacture of the IC, the modifying of masking instructions including:
dividing a region containing the at least one feature into quadrants;
calculating an overlay vector quantity for each of the quadrants;
averaging the overlay vector quantities for all of the quadrants to determine a summation vector for the region; and
shifting, in the mask instructions, a location of a mask used to form the at least one feature in an opposite direction and at an opposite magnitude as the summation vector for the region.

15. The computer program product of claim 13, wherein the inserting of instructions to modify the fill effect in the region containing the at least one feature or the region adjacent the region containing the at least one feature includes:
inserting instructions to add fill to the region containing the at least one feature or the region adjacent the region containing the at least one feature;
modeling an overlay effect in the region or the adjacent region; and
comparing the modeled overlay effect with an overlay vector threshold to determine whether the overlay effect has been minimized.

16. The computer program product of claim 15, wherein the inserting of instructions further includes:
inserting instructions to add additional fill to the region or the adjacent region in response to determining the modeled overlay effect does not exceed the threshold.

17. The computer program product of claim 15, wherein the inserting of instructions further includes:
removing the instructions to add fill to the region or the adjacent region;
modeling an overlay effect in the region or the adjacent region after removing the instructions;
inserting instructions to add fill to a distinct region adjacent the region or the adjacent region, the distinct region having a greatest influence on the overlay effect based upon the modeled overlay effect in the region or the adjacent region after removing the instructions to add fill;
modeling the overlay effect for the region or the adjacent region after adding the fill to the distinct region; and comparing the modeled overlay effect with an overlay threshold to determine whether the overlay effect has been minimized.

\* \* \* \* \*